US012051679B2

(12) United States Patent
Kim et al.

(10) Patent No.: US 12,051,679 B2
(45) Date of Patent: Jul. 30, 2024

(54) BACKSIDE INTERCONNECTION INTERFACE DIE FOR INTEGRATED CIRCUITS PACKAGE

(71) Applicant: Google LLC, Mountain View, CA (US)

(72) Inventors: Namhoon Kim, San Jose, CA (US); Woon-Seong Kwon, Santa Clara, CA (US); Teckgyu Kang, Saratoga, CA (US)

(73) Assignee: Google LLC, Mountain View, CA (US)

( * ) Notice: Subject to any disclaimer, the term of this patent is extended or adjusted under 35 U.S.C. 154(b) by 323 days.

(21) Appl. No.: 17/121,868

(22) Filed: Dec. 15, 2020

(65) Prior Publication Data

US 2022/0189934 A1 Jun. 16, 2022

(51) Int. Cl.
*H01L 25/10* (2006.01)
*H01L 23/498* (2006.01)

(52) U.S. Cl.
CPC ...... *H01L 25/105* (2013.01); *H01L 23/49822* (2013.01); *H01L 23/49883* (2013.01); *H01L 2225/1052* (2013.01); *H01L 2225/107* (2013.01)

(58) Field of Classification Search
CPC .................................................. H01L 25/105
USPC ............................................................ 257/668
See application file for complete search history.

(56) References Cited

U.S. PATENT DOCUMENTS

| | | | |
|---|---|---|---|
| 5,448,496 A * | 9/1995 | Butts | G06F 30/331 716/116 |
| 9,224,454 B2 | 12/2015 | Maheshwari et al. | |
| 10,090,236 B2 | 10/2018 | Jayasena et al. | |
| 10,096,577 B2 | 10/2018 | Kim et al. | |
| 10,289,796 B2 | 5/2019 | Rossi et al. | |
| 10,410,694 B1 | 9/2019 | Arbel et al. | |
| 10,658,322 B2 | 5/2020 | Kwon et al. | |
| 10,742,217 B2 | 8/2020 | Dabral et al. | |
| 11,100,028 B1 * | 8/2021 | Subramaniam | G06F 13/4221 |
| 2006/0163745 A1 | 7/2006 | Yamashita et al. | |
| 2015/0235915 A1 | 8/2015 | Liang et al. | |
| 2019/0131976 A1 | 5/2019 | Chandrasekar et al. | |
| 2019/0371708 A1 | 12/2019 | Delacruz | |
| 2019/0393190 A1 | 12/2019 | Delacruz et al. | |
| 2020/0006235 A1 | 1/2020 | Aleksov et al. | |
| 2020/0006239 A1 | 1/2020 | Zhang et al. | |
| 2020/0035603 A1 | 1/2020 | Rubin et al. | |
| 2020/0051961 A1 | 2/2020 | Rickard et al. | |
| 2020/0098724 A1 | 3/2020 | Liff et al. | |
| 2020/0098725 A1 | 3/2020 | Liff et al. | |
| 2020/0161235 A1 | 5/2020 | Kwon et al. | |

OTHER PUBLICATIONS

Extended European Search Report for European Patent Application No. 21168686.0 dated Oct. 22, 2021. 9 pages.
Office Action for European Patent Application No. 21168686.0 dated Jul. 28, 2023. 4 pages.

* cited by examiner

*Primary Examiner* — Ajay Arora
(74) *Attorney, Agent, or Firm* — Lerner David LLP

(57) ABSTRACT

The technology relates to an integrated circuit (IC) package in which an interconnection interface chiplet and/or interconnection interface circuit are relocated, partitioned, and/or decoupled from a main or core IC die and/or high-bandwidth memory (HBM) components in an integrated component package.

17 Claims, 7 Drawing Sheets

BACKSIDE INTERCONNECTION INTERFACE DIE FOR INTEGRATED CIRCUITS PACKAGE

BACKGROUND

Electronic devices, such as tablets, computers, copiers, digital cameras, smart phones, control systems and automated teller machines, among others, often employ electronic components such as dies that are connected by various interconnect components. The dies may include memory, logic, devices, or other integrated circuit (IC) dies.

The demand for IC dies for higher performance, higher capacity and lower cost has driven the demand for small sizes and more capable microelectronic components. Furthermore, the distribution and the distance among the IC dies also becomes denser and closer.

Device-to-device interfaces, also called interconnects, provide a bridge between the devices, such as between ICs, memory, high bandwidth memories (HBM), system-on-chip (SoCs), FPGAs, ASICs, central processing units (CPUs), graphic processing units (GPUs), etc. As the data rate which can be processed by systems increases, providing interfaces that can keep up with the processing speed of the dies becomes increasingly difficult. Power-efficient, robust, and low-cost device-to-device interconnect interfaces are desirable to meet the needs of high-performance systems. Some examples of device-to-device interfaces include high bandwidth memory (HMB) physical layer (PHY), I/O, high speed serializer/deserializer (SerDes) I/O, etc.

However, such interconnect interfaces may also consume power and occupy large area on the IC dies, which may limit the dimension or sizes of the IC dies and constrain circuit layout and increase manufacturing complexity.

SUMMARY

The present disclosure relates to an integrated circuit (IC) package. The integrated circuit (IC) package includes an interconnection interface chiplet or interconnection interface circuit that has been relocated, partitioned or decoupled from a main or core IC die and/or high-bandwidth memory (HBM) components in an integrated circuit package. Thus, areas of the main or core IC die and/or high-bandwidth memory (HBM) components may be enlarged or maximized as the interconnection interface chiplet is separated therefrom. One aspect of the disclosure provides an integrated circuit (IC) package. An interposer is disposed on a first surface of a package substrate. A first IC logic die disposed on the interposer. An interconnection interface chiplet is disposed on a second surface of the package substrate opposite the first surface of the package substrate.

In one example, an integrated voltage regulator is disposed on the second surface of the package substrate. The integrated voltage regulator is physically connected to the interconnection interface chiplet. The integrated voltage regulator is configured to supply a power to the interconnection interface chiplet. The first IC logic die comprises Bunch of Wires (BoW) interface or equivalent device to device IO interfaces.

In one example, the interconnection interface chiplet includes a SerDes chiplet or a component interconnect express (PCIe) chiplet. A plurality of high bandwidth memory (HBM) devices is formed on the interposer. Each of the HBM devices includes a physical (PHY) interface configured to horizontally aligned with a PHY interface in the first IC logic die. A side of the first IC logic die is aligned with a side of the interposer. The interconnection interface chiplet is electrically connected to the first IC logic die through connectors formed in the interposer and the package substrate.

In one example, the package substrate includes an organic substrate. The organic substrate includes a core organic material, a first plurality of build-up layers disposed on the core organic material facing the interposer and a second plurality of build-up layers disposed below the core organic material facing a printed circuit board (PCB). The interconnection interface chiplet is disposed in close proximity to a solder ball disposed on a printed circuit board (PCB). The interconnection interface chiplet is disposed vertically below the first IC logic die.

In one example, a second IC logic die disposed side by side in close proximity to the first IC logic die. The first and the second IC logic dies do not have an input/output interface.

Another aspect of the technology is directed to an integrated circuit (IC) package including an IC logic die disposed on a first surface of a package substrate. An interconnection interface chiplet is disposed on a second surface of the package substrate opposite to the first surface of the package substrate.

In some example, the IC logic die comprises Bunch of Wires (BoW) interface or equivalent IO interfaces. An integrated voltage regulator is disposed on the second surface of the package substrate.

Yet another aspect of the technology is directed to an integrated circuit (IC) package including an IC logic die disposed on a first surface of a package substrate. An interconnection interface chiplet disposed on a second surface of the package substrate vertically below the IC logic die.

DETAILED DESCRIPTION

The technology relates generally to relocating, partitioning and/or decoupling an interconnection interface chiplet or interconnection interface circuit from a main or core IC die and/or high-bandwidth memory (HBM) components in an integrated component package. By partitioning the interconnection interface chiplet or interface circuits into distinct or individual dies or chiplets and relocating such dies or chiplets to other locations in the integrated circuit (IC) package, more area is available. This additional area may be used to scale up the main or core IC dies and/or high-bandwidth memory (HBM) components, so that additional or different types of the devices, capacitors, or circuit dies may be included in the integrated component package. This results in improved product yield, device density and product performance.

Figure 1:
FIG. 1 depicts a top view of an integrated circuit (IC) package in accordance with aspects of the disclosure.

FIG. 1 depicts a top view of an integrated circuit (IC) package 101 including multiple devices formed on an interposer 150. For example, the integrated circuit (IC) package 101 may include at least one IC die, such as at least a core or main IC logic die. In the example depicted in FIG. 1, a first IC logic die 102 and a second IC logic die 104 are disposed side by side on the interposer 150. A plurality of memory devices 106a-106h may be formed around sides of the IC logic dies 102, 104. In the example depicted in FIG. 1, the plurality of memory devices 106a-106g are disposed in close proximity to the logic dies 102, 104. In one example, the memory devices 160a-106h utilized herein are high-bandwidth memory (HBM) components. It is noted that other types of the memory devices or memory stacks may be utilized for the memory devices 106a-106h.

In one example, a first plurality of physical (PHY) interfaces 110a-110h may be formed on edges or sides of the IC logic dies 102, 104 while a second plurality of PHY interfaces 112a-112h formed on edges of the memory devices 106a-106h. The first and the second PHY interfaces 110a-110h, 112a-112h are in electrical and/or physical connection to facilitate communications between the IC logic dies 102, 104 and the memory devices 106a-106h. In one example, the memory devices 106a-106h are disposed on opposing sides of the IC logic dies 102, 104.

Figure 2:
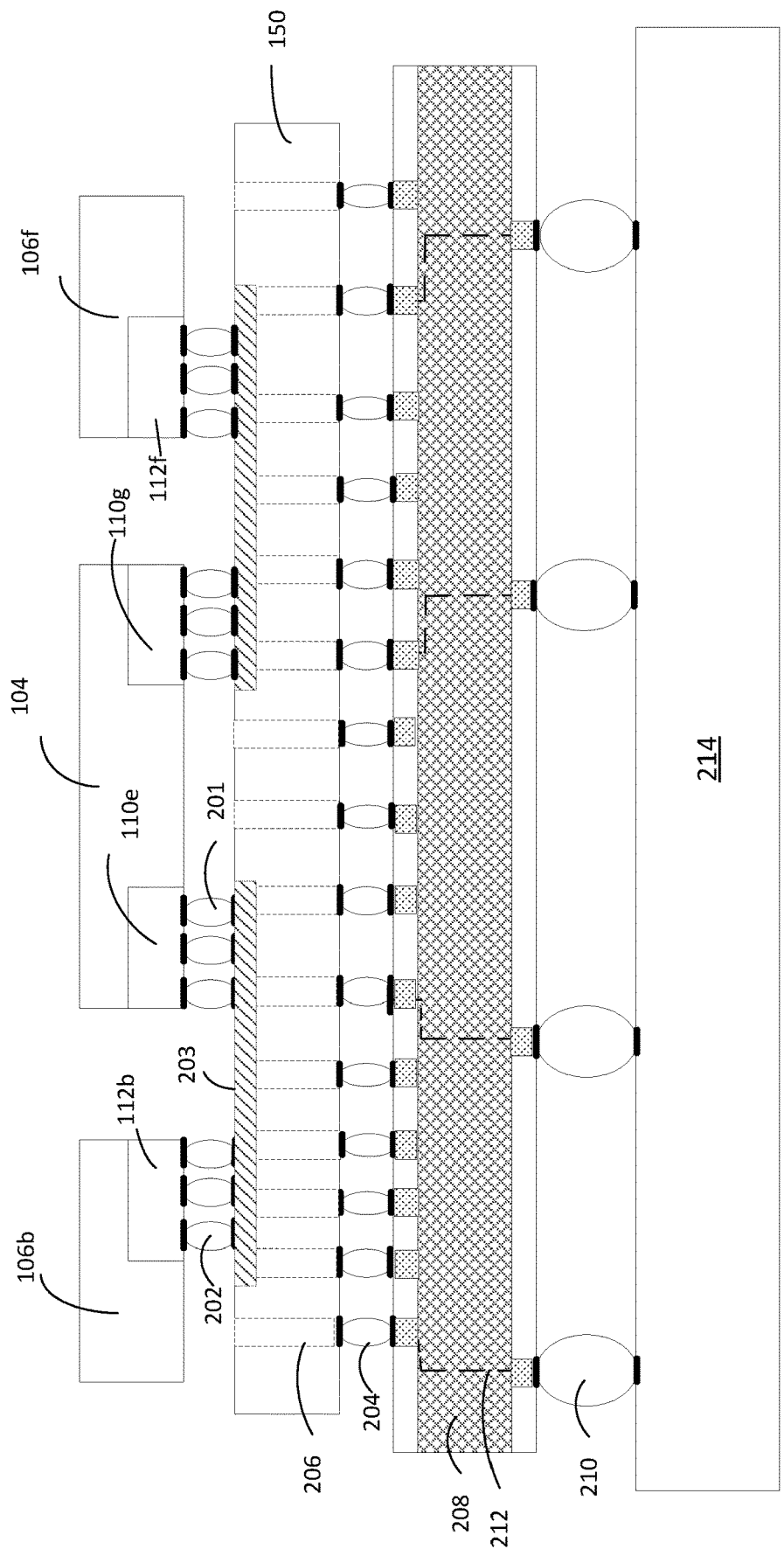
FIG. 2 depicts a cross-sectional view of the integrated circuit (IC) package along the line A-A of FIG. 1 in accordance with aspects of the disclosure.

In one example, the PHY interfaces 110a-110h in the IC logic dies 102, 104 includes a first set of physical connections 201, as shown in FIG. 2, to facilitate connection to the interposer 150 while the PHY interfaces 112a-112h in the memory devices 106a-106h includes a second set of physical connections 202 to facilitate connection to the interposer 150. The first and the second set of the physical connections 201, 202 may be connected through a connection channel 203 formed in the interposer 150.

The connections between the IC logic dies 102, 104 to the memory devices 106a-106h may provide communications of signals, commands and addresses from the IC logic dies 102, 104 to the memory devices 106a-106h. A first device to device (D2D) high bandwidth interface (HBI) 130a is formed in the first IC logic die 102 to be in communication with a respective second D2D HBI 130b formed in the second IC logic die 104 to facilitate electrical connection between the first and the second logic dies 102, 104. Furthermore, another set of HBI 132a, 132b, 132c and 132d, 132e may be formed on an opposite side from where the first D2D HBI 130a, 130b are formed in the first and the second IC logic dies 102, 104 respectively. In one example, a first set of HBI 132a, 132b, 132c in the first logic IC die 102 may be configured to in communication with a respective interconnection interface (ICI) chiplets 142a, 142b 142c located at an upper boundary of the first logic IC die 102. A second set of HBI 132d, 132e, 132f in the second logic IC die 104 may be configured to in communication with an ICI 140 chiplet located in a bottom boundary of the second logic IC die 104.

In one example, the ICI chiplet 140 located at the bottom boundary may be a peripheral component interconnect express (PCIe) for connecting the second IC logic die 140 to other high-speed components. The ICI chiplets 142a, 142b 142c located at the upper boundary may utilizes SerDes chiplets 142a, 142b 142c that allows large amount of data to be communicated at high speed from the first IC logic die 102 to other device components. The SerDes chiplets 142a, 142b 142c includes an integrated circuit, die or device used in high-speed communications that converts between serial data and parallel interface, in either direction. The SerDes chiplets 142a, 142b 142c, or called SerDes dies or SerDes chiplets, are used for providing data transmission over a differential or single line by minimizing the number of input/output pins and connections. However, as the demand for high density circuits as well as small dimension of the device components are increasing, the ICI, including the SerDes chiplets 142a, 142b 142c as well as the PCIe chiplet may still undesirably occupy a large amount of the available area in the IC package 101, thus straining available area that may be utilized for the IC logic dies or memory devices.

FIG. 2 depicts a cross-sectional view of the IC package 101 along line A-A of FIG. 1. As discussed above, the IC logic die 104 is disposed on the interposer 150 through the plurality of connectors 201. The connectors 201 may be gold, nickel, tin, copper, solder, aluminum, tungsten or other suitable conductive materials. The IC logic die 104 and the memory device 106b, 106f are electrically and/or physically connected through the PHY interfaces 110e, 112b, 110g, 112f in connection with the respective plurality of connectors 202, 201, which are coupled to the connection channels 203 formed in the interposer 150.

The interposer 150 may have a plurality of through substrate vias (TSVs) 206 formed across a body of the interposer 150. The TSVs may provide electrical connection channels to facilitate electrical connection of the IC logic dies 104 and the memory devices 106a-h to a package substrate 208 disposed thereunder. The interposer 150 and the package substrate 208 may assist integrating and stacking multiple dies, components, devices and chiplets in a vertically three-dimensional (3D) fashion so as to improve the packaging density.

In one example, the package substrate 208 may further have TSVs or interconnection channels 212 to facilitate connection of the package substrate 208 to a printed circuit board (PCB) 214, socket, or other such chip carrier, through a plurality of solder balls 210 arranged in a ball grid array (BGA). Other such arrangements and connectors may include contacts arranged in a land grid array (LGA), connector pins arranged in a pin grid array (PGA), etc.

The numbers and positions of the connectors 201, 204, the connection channels 203, TSVs 206, interconnection channels 212, or solder balls 210 depicted in FIG. 2 are only for illustration and can be arranged in any manners or arrangement based on the device performance designs, layouts and considerations.

Figure 3:
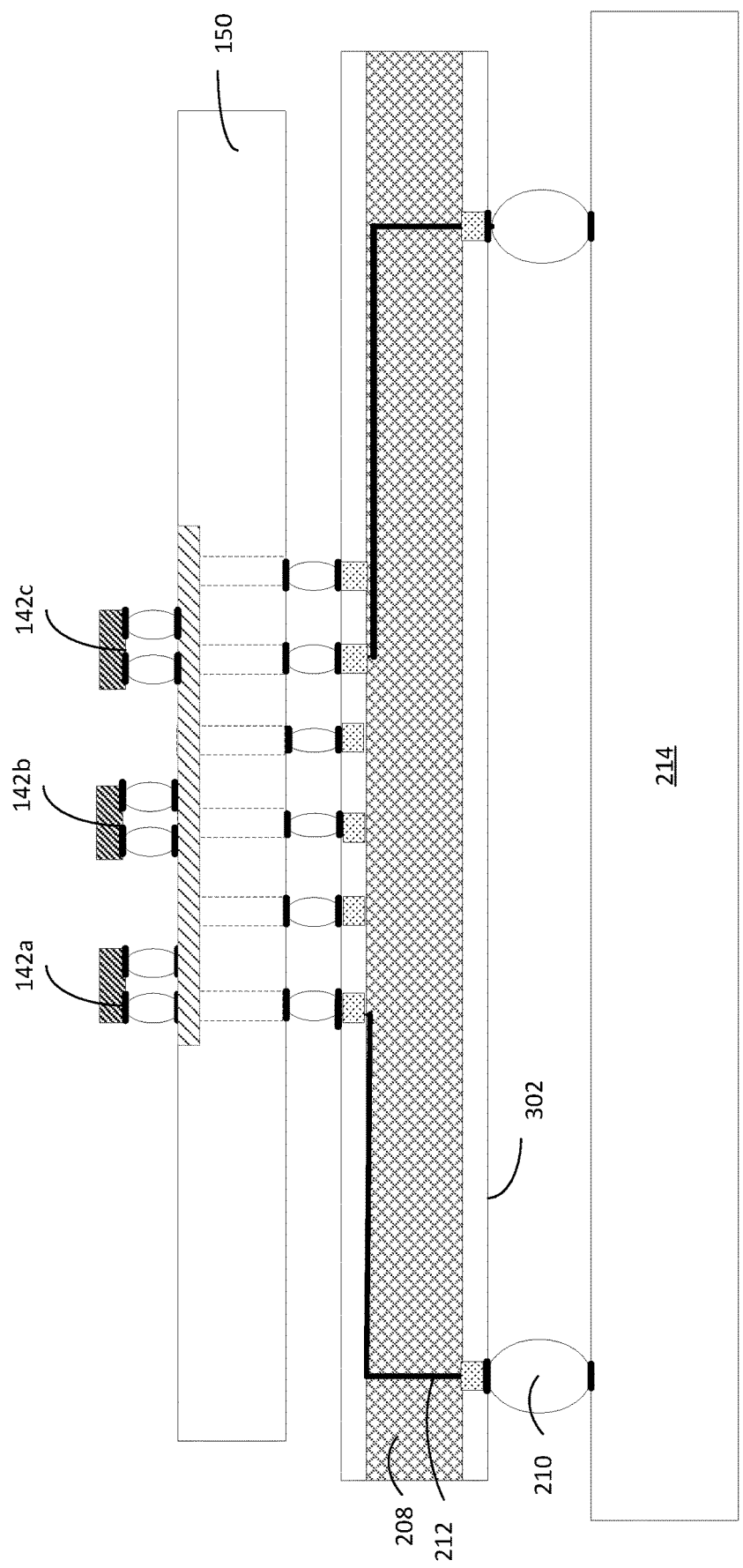
FIG. 3 depicts a cross-sectional view of the integrated circuit (IC) package along the line B-B of FIG. 1 in accordance with aspects of the disclosure.

FIG. 3 depicts a cross sectional view of the integrated circuit (IC) package 101 along the cutting line B-B. As discussed above, conventionally, the ICI chiplets 142a, 142b, 142c are utilized to provide an input/output interface to facilitate electrically communications of the IC logic dies 102, 104 to other components located nearby through the high bandwidth interfaces (HBI) 132a, 132b, 132c disposed therein. However, such interconnection interface chiplets 142a, 142b, 142c, such as SerDes interfaces, or called SerDes dies, high speed interfaces or high speed serial interfaces, often undesirably occupy a quite amount of area and space in the IC package 101. Furthermore, the connection channel length from the ICI chiplets 142a, 142b, 142c to the solder balls 210 disposed on the bottom side of the package substrate 208 is often long, thus, adversely increasing communication speed and signal transmission distance. Furthermore, as the ICI chiplets 142a, 142b, 142, the IC logic dies 102, 104 and the HBM devices 106a-106h are collectively located on the same horizontal plane defined by the interposer 150, connection paths or channels routing among these devices are often complicated and cramped as the horizontal plane defined by the interposer 150 has limited available channel space.

Figure 4:
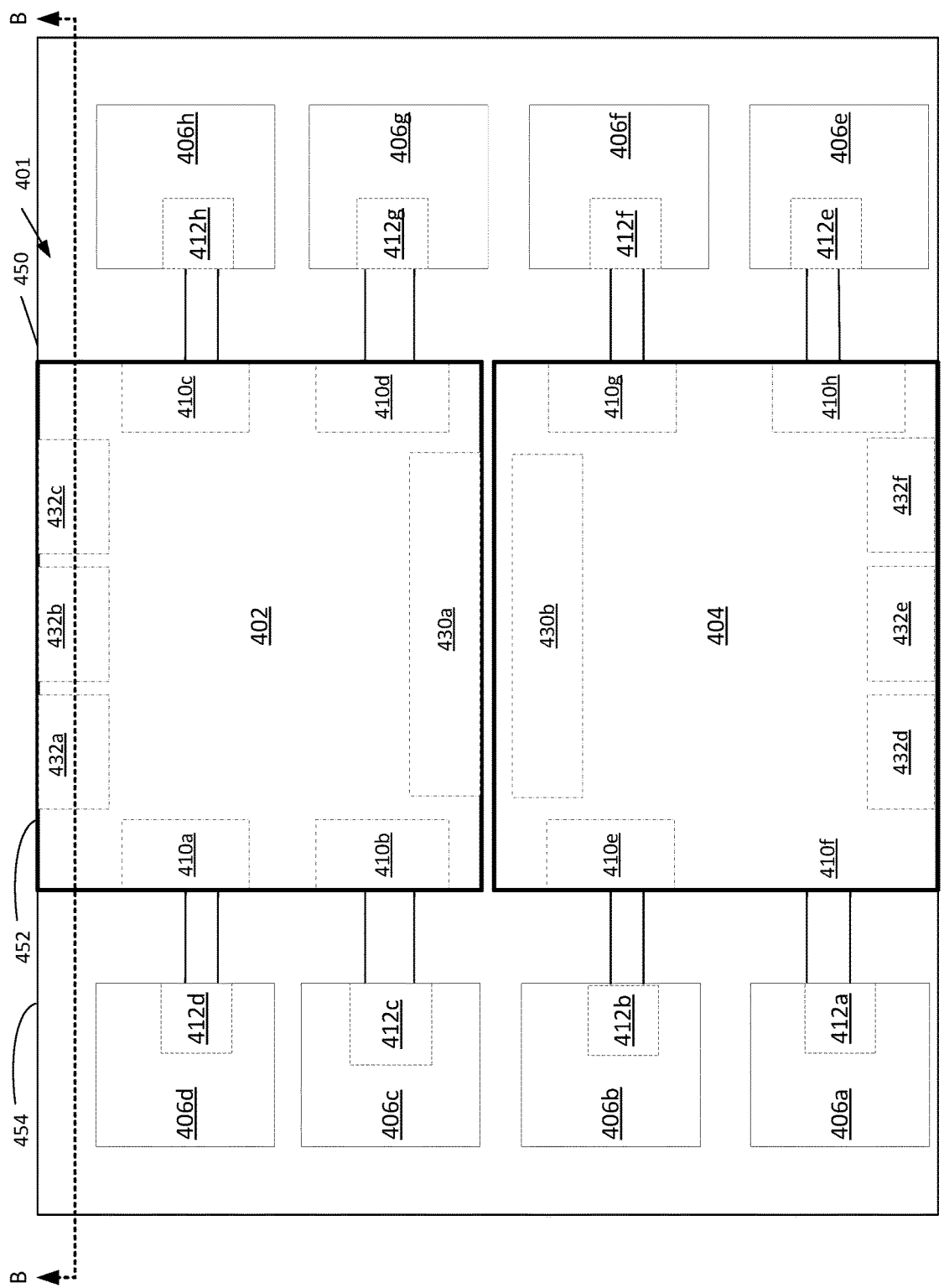
FIG. 4 depicts a top view of an integrated circuit (IC) package including an interconnection interface chiplet separated from an IC die in accordance with aspects of the disclosure.

FIG. 4 depicts a top view of an integrated circuit (IC) package 401 including multiple devices formed on an interposer 450. The IC package 401 includes at least one IC main or core die. For example, a first IC logic die 402 and a second IC logic die 404 are disposed side by side on the interposer 450. The logic dies 402, 404 located in the IC package 401 may be any suitable device dies. A plurality of memory devices 406a-406h may be formed around sides of the IC logic dies 402, 404. In the example depicted in FIG. 4, the plurality of memory devices 406a-406h are disposed in close proximity to the logic dies 402, 404. In one example, the memory devices 406a-406h utilized herein are high-bandwidth memory (HBM) components. It is noted that other types of the memory devices or memory stacks may be utilized for the memory devices 406a-406h.

In one example, a first plurality of physical (PHY) interfaces 410a-410h may be formed on edges of the first and the second IC logic dies 402, 404 while a second plurality of PHY interfaces 412a-412h are formed on edges of the memory devices 406a-406h. The first and the second PHY interfaces 410a-410h, 412a-412h are in electrical and/or physical connection to facilitate communications between the IC logic dies 402, 404 and the memory devices 406a-406h. In one example, a first D2D high bandwidth interface (HBI) 430a is formed in the first IC logic die 402 to be in electrical communication with a second D2D HBI 430b formed in the second IC logic die 404.

In the example depicted in FIG. 4, a first set of interconnection interfaces (ICIs) 432a, 432b, 432c may be disposed on an upper boundary of the first IC logic die 402 to facilitate communication to other devices or components, and a second set of ICIs 432d, 432e, 432f may be disposed on a bottom boundary of the second IC logic die 404 to facilitate further electrical communications of the second IC logic die 404 to other components. As discussed above, the conventional ICI chiplets, such as SerDes interfaces, or called SerDes dies, HBI interfaces, PCIe dies, or other similar interfaces, often undesirably occupy a greater percentage of the overall size of the integrated circuit package. Furthermore, communications between the ICI and the farthest IC logic dies or HBM may be complicated and complex due to limited area of the same horizontal plane defined by the interposer.

Figure 5:
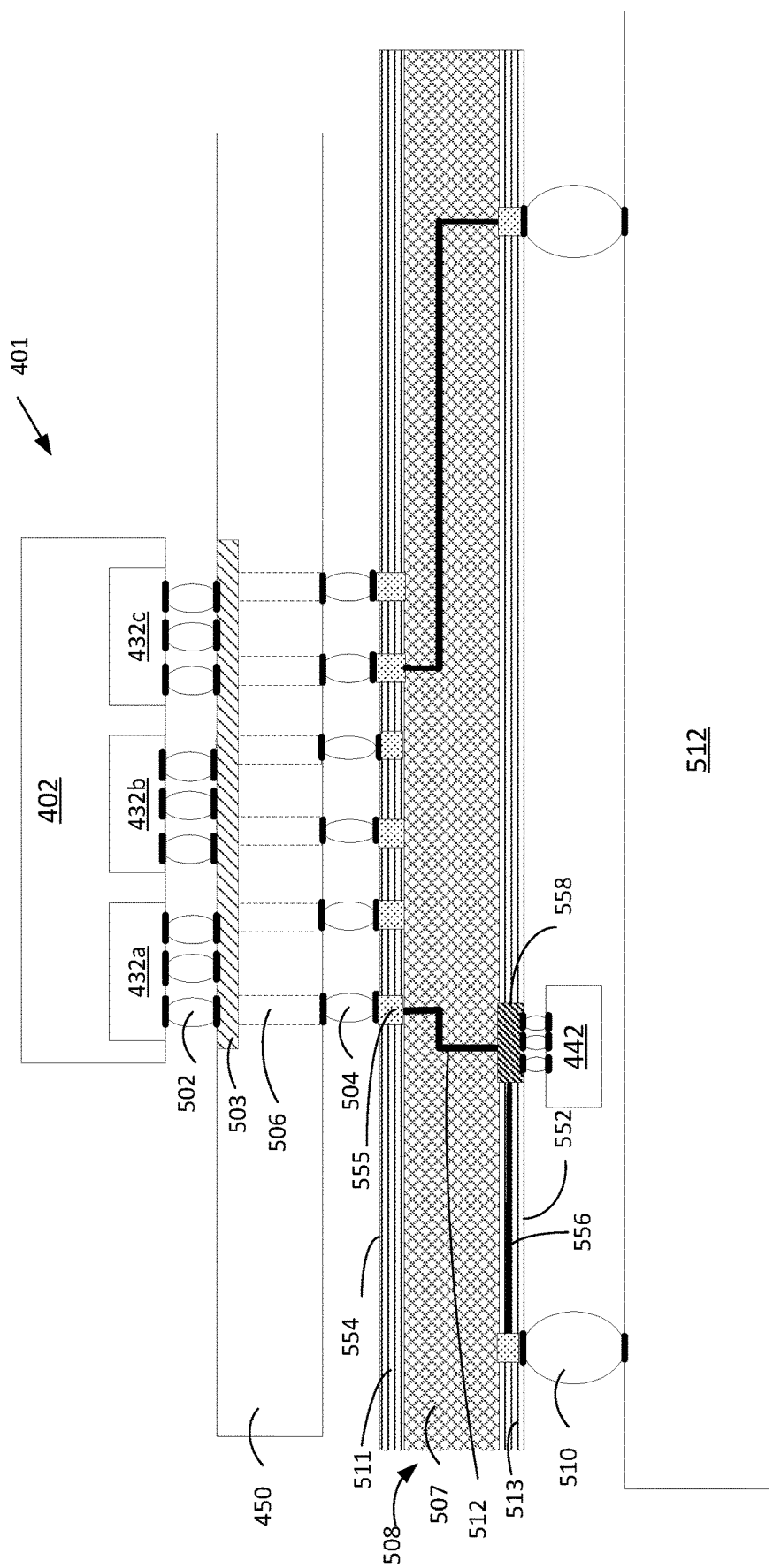
FIG. 5 depicts a cross-sectional view of an integrated circuit (IC) package including an interconnection interface chiplet formed on a bottom portion of the package substrate in accordance with aspects of the disclosure.

Thus, the interconnection interfaces 432a, 432b, 432c 432d, 432e, 432f, as depicted in FIG. 4 configured in the first and the second IC logic dies 401, 404, are selected to provide an interface with relatively smaller geometries while providing good signal transmission performance. Furthermore, the corresponding respective interconnection interface chiplets with which the interconnection interfaces 432a, 432b, 432c 432d, 432e, 432f are electrically comminuted are partitioned into separated dies or separated chiplets so that such interconnection interface chiplets may be moved to other suitable locations, such as a bottom surface of the package substrate, which will be described further below with reference to FIGS. 5-6. For example, the corresponding respective ICI chiplets, such as the ICI chiplets 142a-c, 140 described in FIG. 1, are partitioned and separated from the IC logic dies and moved to other suitable locations, such as a bottom surface of the package substrate, instead of locating on the interposer. As shown in the example depicted from the top view of FIG. 4, the corresponding respective interconnection interface chiplets are not disposed on the interposer 450 in close proximity to the IC logic dies 401, 404. Instead, the interconnection interface chiplet, such as the interconnection interface chiplet 442, is relocated to a bottom surface 552 of the package substrate 508, as shown in FIG. 5, which will be described below in detail. Thus, the IC logic dies 401, 404 located on the interposer 450 do not have other input/output interfaces, such as the interconnection interface chiplets 442.

In one example, the ICIs 432a, 432b, 432c 432d, 432e, 432f as selected for the first and the second logic dies 402, 404 are Bunch of Wires (BoW) interface or equivalent IO interfaces, which may provide minimum transmission requirements of 2 Gbps data rate, 1 Ghz clock rate under unterminated I/O, or the like. The BoW interface or equivalent IO interfaces are believed to be operated at higher data rates per pin, such as greater than 20 Gbps. Furthermore, the BoW interface or equivalent IO interface is believed to provide a good integration interface when the package substrate, such as the package substrate 508 depicted in FIG. 5, includes an organic material.

FIG. 5 depicts a cross sectional view of the IC package 401 along line B-B. In one example, the ICIs 432a, 432b, 432c, 432d, 432e, 432f in the first IC logic die 402 are configured to be BoW interface or equivalent IO interfaces, while the respective ICI chiplet 442 has been partitioned as a separate chiplet and relocated to be on the bottom surface 552 of the package substrate 508, or other suitable locations in the IC package 401. By doing so, the area, where the ICI chiplets 442 used to occupy, on the interposer 450 may be saved and further utilized, such as scaling up and maximizing the dimension of the first and the second IC logic dies 402, 404, to improve electrical performance or reduce manufacturing complexity. Alternatively, the saved area on the interposer 450 may be utilized for other purposes, such as incorporating additional devices, IC dies or chiplets with different functions or purposes based on the device design requirements and needs. As shown in the top view depicted in FIG. 4, a side 452 of the first IC logic dies 402, 404 may be extended to be aligned with a side 454 of the interposer 450 to maximize the area that may be allowed for manufacturing the IC logic dies 402, 404 on the interposer. Similar arrangements may also be configured for manufacturing or configuring the second IC logic die 404.

Furthermore, as the dimensions of the IC logic dies 402, 404 are enlarged, the HBM PHY interfaces 410a-410h formed in the IC logic dies 402, 404 may then be able to connected to the PHY interfaces 412a-412h of the memory devices 406a-406h in a relatively linear fashion with a relatively short distance so as to improve the HBM transmission performance. For example, the HBM PHY interfaces 410a-410h formed in the IC logic dies 402, 404 may be able to horizontally aligned with the PHY interfaces 412a-412h of the memory devices 406a-406h so as to decrease the travel distance of the electrical signals transmitted between the PHY interfaces 410a-410h, 412a-412h.

Referring back to FIG. 5, as described above, the interconnection interface 432a, 432b, 432c in the first IC logic die 402 are configured to be BoW interfaces or equivalent IO interfaces. The first IC logic die 402 and/or the second IC logic die 404 is disposed on the interposer 450 through a plurality of connectors 502. The connection channel 503 is formed on an upper surface 554 of the interposer 450 to facilitate the physical and electrical connection of the interconnection interface 432a, 432b, 432c in the first IC logic die 402 to the interposer 450. The ICI chiplets 442, which conventionally is often disposed in the same plane, such as horizontally co-plane with the first IC logic die 402, on the interposer is configured to be disposed on the bottom surface 552 of the package substrate 508. The separation and/or relocation of the ICI chiplet 442 to the bottom surface 552 of the package substrate 508, or other locations in the IC package 401, allows a vertical stacking among the ICI chiplets 442 and the IC logic dies 402, 404. The vertical stacking of the ICI chiplet 442 and the IC logic dies 402, 404 may also allow a relatively short and simple communication path routing in a vertical manner, such as through the connectors 502, 504, TSVs 506, interconnection channels 512, or other connecting structures formed in the interposer 450, between the interposer 450 and the package substrate 508 and/or other structures in the IC package 401. Thus, a relatively simple and straightforward vertical path routing and vertical communication path may be obtained to facilitate electrical communication between the ICI chiplet 442 and the IC logic dies 402, 404, as opposed to detouring the routing path horizontally on the interposer 450 among the ICI chiplet 442 and the IC logic die 402 when the ICI chiplet 442 is positioned side by side and/or co-plane with the IC logic die 402. Thus, an additional dimensional placement, such as the vertical stacking, is enabled to provide additional alternatives for device dies arrangement, layout and increase the overall density of the dies, devices and components disposed in the IC package 401.

In the example depicted in FIG. 5, the ICI chiplet 442 may be disposed in close proximity to the solder balls 510 so as to reduce the communication path 556 therebetween and improve signal transmission performance. The ICI chiplet 442 may be located and placed in any suitable locations on the bottom surface 552 of the package substrate 508.

In one example, the package substrate 508 may be an organic substrate. The package 508 includes an organic core material 507, a first plurality of build-up layers 511 formed on top of the organic core material 507, and a second plurality of build-up layers 513 formed below the organic core material 507. Each build-up layer of the first and the second plurality of build-up layers 511, 513 may include a metal build-up layer, and/or a dielectric build-up layer. The metal build-up layers of the respective build-up layers 511, 513 may be connected through metal vias 555, 558 formed in the first and the second plurality of build-up layers 511, 513. Additionally, the first and the second plurality of build-up layers 511, 513 may be electrically connected through the interconnection channels 512 in the organic core material 507. Accordingly, the ICI chiplet 442 may be in electrical connections to the IC logic die 402 through the interconnection channels in the organic core material 507, the metal vias 555, 558 formed in the first and the second plurality of build-up layers 511, 513, TSVs 506 formed in the interposer 450, the connectors 502, 504 and other suitable conductive structures formed therein.

In one example, the ICI chiplet 442 as partitioned from the IC logic die 402 may be SerDes dies, HBI interfaces, PCIe dies, component IO interconnect chiplet, high speed interface IO, parallel or serial interface IO dies, or other suitable interface chiplets.

Figure 6:
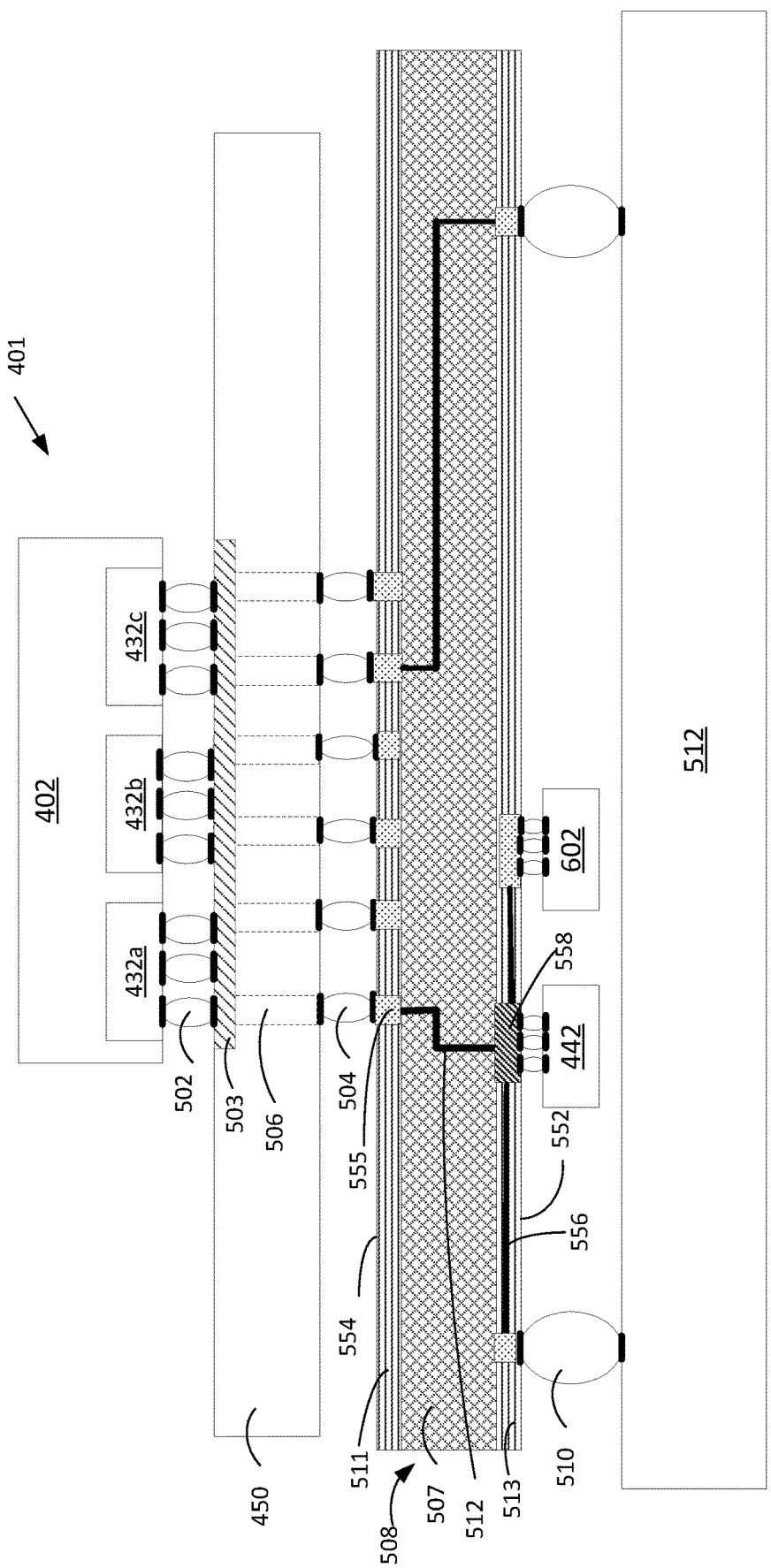
FIG. 6 depicts a cross-sectional view of a package substrate including an interconnection interface chiplet and an integrated voltage regulator formed on a bottom portion of the package substrate in accordance with aspects of the disclosure.

FIG. 6 depicts another example of the cross-sectional view of the IC package 401 along line B-B. In addition to the ICI chiplet 442 relocated to the bottom surface 552 of the package substrate 508, additional device dies, components or chiplets may also be disposed on the bottom surface 552 of the package substrate 508. In the example depicted in FIG. 6, an integrated voltage regulator (IVR) 602 may be disposed in close proximity to the ICI chiplet 442. Thus, power may be delivered to the IC logic die 402, 404 through the ICI chiplet 442 from the IVR 602 using the metal wiring or backside power distribution network, including the interconnection channels 512, the metal vias 555, 558 and the connectors 502, 504, TSVs 506, etc.

In one example, power received by IVR 602 may be considered the input power supply. The input power supply may be delivered to the IVR 602 at a higher voltage level and lower current level than the input power supply delivered directly to the IC logic die 402, 404. The IVR 602 may provide power to the IC logic die 402, 404 through the ICI chiplet 442 with a different supply voltage level. For example, the IVR 602 may operate as a switching voltage regulator and adjust the amount of voltage supplied to the ICI chiplet 442 and/or further to the IC logic die 402, 404 based on the needs of the IC logic die 402, 404 or other components within the IC package 401. In some examples, the integrated voltage regulator 602 may include a closed loop feedback system to provide a steady voltage output.

As the integrated voltage regulator 602 is located relatively far away from the IC logic die 402, 404, the integrated voltage regulator 602 may be configured to accept higher input voltages without generating excess heat, thus reducing the current supplied to the IC package 401 by an external power supply. Accordingly, the amount of current carried by the wires, traces, connectors, channels, TSVs, and/or other such connections on or within the IC package 401 may be reduced, resulting in a decrease in the amount of copper losses and minimizing electromigration failure risk in the IC package 401. Moreover, the integrated voltage regulator 602 may reduce overall power consumption and increase power efficiency of the IC package 401.

It is noted that other features, such as inductors, capacitors, metal-insulator-metal (MIM) structures, and other suitable features or structures may also be disposed on the bottom surface 552 of the package substrate 508.

The locations where ICI chiplet 442, and/or the integrated voltage regulator 602 may or may not be vertically aligned with and the IC logic die 402, 404. For example, the ICI chiplet 442, and/or the integrated voltage regulator 602 may be located at any suitable locations on the bottom surface 552 of the package substrate 508 vertically below the IC logic die 402, 404, below the HBM devices 406a-406h, below areas among the IC logic die 402, 404 and HBM devices, or edge areas without device dies or components disposed on the interposer 450. Although only one ICI chiplet 442 and one integrated voltage regulator 602 are shown in FIG. 6, it is noted that the ICI chiplet 442 and the integrated voltage regulator 602 may be in any numbers.

Figure 7:
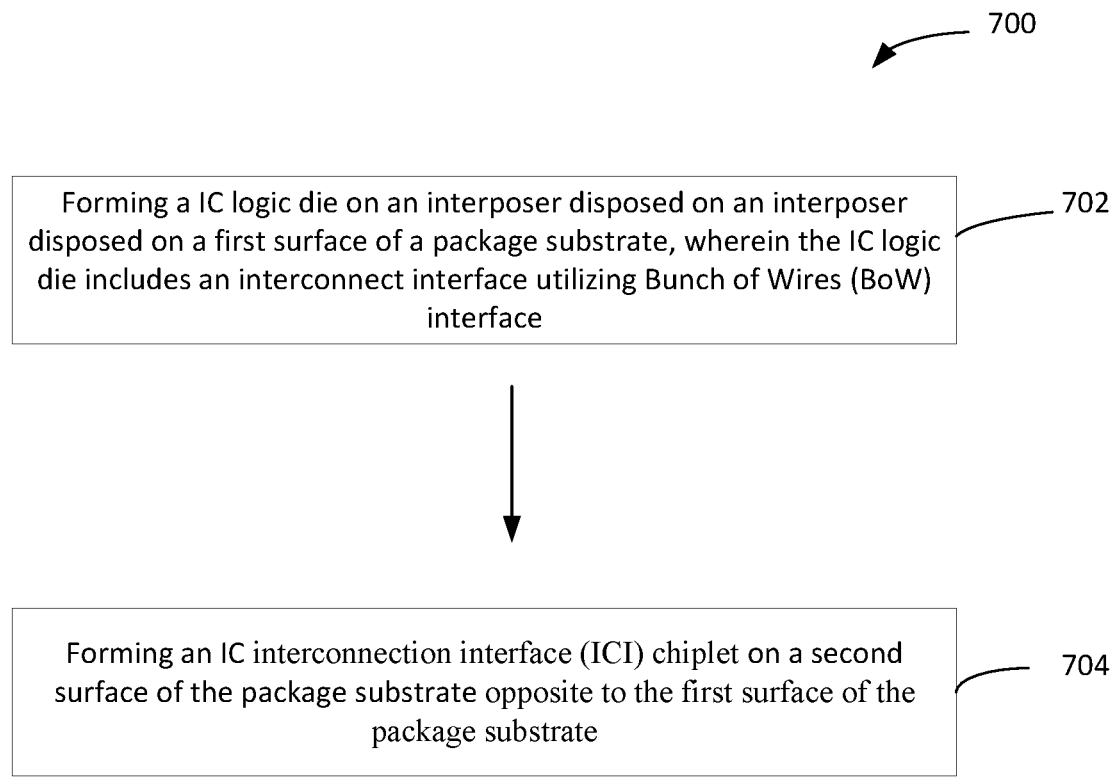
FIG. 7 depicts a flow diagram for manufacturing an integrated circuit (IC) package including an interconnection die and/or an integrated voltage regulator formed on a bottom portion of the package substrate in accordance with aspects of the disclosure.

FIG. 7 depicts a flow diagram for manufacturing an IC package, such as the IC package 401 depicted in FIG. 4-6, including an ICI chiplet 442 and/or an integrated voltage regulator 602 formed on a bottom surface 552 of the package substrate 508 in accordance with aspects of the disclosure. Such method may be performed using a suitable manufacturing processes, including deposition, etching, lithography, polishing, soldering, or any suitable techniques. It should be understood that the operations involved in the following methods need not be performed in the precise order described. Rather, various operations may be handled in a different order or simultaneously, and operations may be added or omitted.

Referring to FIG. 7, in block 702, an IC logic die may be formed on an interposer disposed on a first surface of a package substrate. For example, in the example depicted in FIGS. 4-6, a first IC logic die 402 or a second IC logic die 404 may be formed on the interposer 450 disposed on a first surface, such as the upper surface 554 of the package substrate 508. It is noted that other structures, such as memory devices 406a-406h or other device structures, may also be formed on the interposer 450 for electrical performance considerations or functionality requirements. The first IC logic die 402 or the second IC logic die 404 may utilize a plurality of BoW interfaces 432a, 432b, 432c, 432d, 432e, 432f or equivalent IO interfaces to facilitate electrical connections of the first IC logic die 402 or the second IC logic die 404 to other components or devices in and/or external from the IC package 401. The electrical and physical connection between the first IC logic die 402 and the second IC logic die 404 may utilize D2D HBI interface. The electrical and physical connection between the first IC logic die 402 and/or the second IC logic die 404 and the memory devices 406a-406h may utilize HBM PHY interfaces 410a-410h.

In block 704, an ICI chiplet is then formed on a second surface of the package substrate, opposite to the first surface where the interposer is disposed. For example, in the example depicted in FIGS. 4-6, the ICI chiplet 442 and/or an IVR 602 is formed on the bottom surface 552 of the package substrate 508. Thus, the ICI chiplet 442 is partitioned from the first IC logic die 402 and/or the second IC logic die 404 and vertically stacked in the IC package 401 to simplify the routing path configurations in the IC package 401 and increase the available area that may be utilized for manufacturing the first IC logic die 402 and/or the second IC logic die 404 or utilization of further additional device dies, components, or chiplets on the interposer 450 in the IC package 401. Thus, the first IC logic die 402 and/or the second IC logic die 404 disposed on the interposer do not have other ICI chiplets, such as no other input/output (I/O) interfaces.

Although the example IC package 401 described herein is described with reference to two IC logic dies 402, 404 and eight HBM devices 406a-406h, each IC package may include any number of logic dies, memories or other suitable devices. Moreover, each example IC package may include any number of voltage regulators or other components.

The features described herein allow for the separation and/or partition of ICI chiplet from IC logic dies in an IC package. In one example, BoW interfaces may be utilized in the IC logic dies when the ICI chiplet are partitioned from the IC logic dies. Separation of the ICI chiplet from IC logic dies may provide more available or usable area on the interposer that allows that IC logic dies to scale on their dimensions so as to improve computing performance Thus, the IC logic dies located on the interposer do not require additional or other input/output ICI chiplets.

Although the technology herein has been described with reference to particular examples, it is to be understood that these examples are merely illustrative of the principles and applications of the present technology. It is therefore to be understood that numerous modifications may be made and that other arrangements may be devised without departing from the spirit and scope of the present technology as defined by the appended claims.

The invention claimed is:

1. An integrated circuit (IC) package comprising:
   an interposer disposed on a first surface of a package substrate;
   a first IC logic die disposed on the interposer;
   an interconnection interface chiplet disposed on a second surface of the package substrate opposite the first surface of the package substrate, wherein the interconnection interface chiplet is partitioned from the first IC logic die; and
   an integrated voltage regulator disposed on the second surface of the package substrate and adjacent to the interconnection interface chiplet, wherein the integrated voltage regulator is physically connected to the interconnection interface chiplet and is connected to other components through the interconnection interface chiplet.

2. The IC package of claim 1, wherein the integrated voltage regulator is configured to supply a power to the interconnection interface chiplet.

3. The IC package of claim 1, wherein the first IC logic die comprises a Bunch of Wires (BoW) or an equivalent device to device interface.

4. The IC package of claim 1, wherein the interconnection interface chiplet comprises a serializer-deserializer (SerDes) chiplet or a component IO interconnect chiplet.

5. The IC package of claim 1, further comprising:
   a plurality of high bandwidth memory (HBM) devices formed on the interposer.

6. The IC package of claim 5, wherein:
   the interposer, the first IC logic die, and the interconnection interface chiplet are vertically stacked, and
   each of the HBM devices comprises a physical (PHY) interface horizontally aligned with a PHY interface in the first IC logic die.

7. The IC package of claim 5, wherein a side of the first IC logic die is aligned with a side of the interposer.

8. The IC package of claim 1, wherein the interconnection interface chiplet is electrically connected to the first IC logic die through connectors formed in the interposer and the package substrate.

9. The IC package of claim 1, wherein the package substrate comprises an organic substrate.

10. The IC package of claim 9, wherein the organic substrate further comprises:
    a core organic material;
    a first plurality of build-up layers disposed on the core organic material facing the interposer; and
    a second plurality of build-up layers disposed below the core organic material facing a printed circuit board (PCB).

11. The IC package of claim 1, wherein the interconnection interface chiplet is disposed in close proximity to a solder ball disposed on a printed circuit board (PCB).

12. The IC package of claim 1, wherein the interconnection interface chiplet is disposed vertically below the first IC logic die.

13. The IC package of claim 1, further comprising:
    a second IC logic die disposed side by side in close proximity to the first IC logic die.

14. The IC package of claim 13, wherein the first and the second IC logic dies located on the interposer share an interface with the interconnection interface chiplet located on the second surface of the package substrate and do not require additional input/output interconnection interface chiplets.

15. An integrated circuit (IC) package comprising:
- an IC logic die disposed on a first surface of a package substrate;
- an interconnection interface chiplet disposed on a second surface of the package substrate opposite to the first surface of the package substrate wherein the interconnection interface chiplet is partitioned from the IC logic die; and
- an integrated voltage regulator disposed on the second surface of the package substrate and adjacent to the interconnection interface chiplet, wherein the integrated voltage regulator is physically connected to the interconnection interface chiplet and is connected to other components through the interconnection interface chiplet.

16. The IC package of claim 15, wherein the IC logic die comprises Bunch of Wires (BoW) or equivalent device to device interface.

17. An integrated circuit (IC) package comprising:
- an IC logic die disposed on a first surface of a package substrate;
- an interconnection interface chiplet disposed on a second surface of the package substrate vertically below the IC logic die, wherein the interconnection interface chiplet is partitioned from the IC logic die; and
- an integrated voltage regulator disposed on the second surface of the package substrate and adjacent to the interconnection interface chiplet, wherein the integrated voltage regulator is physically connected to the interconnection interface chiplet and is connected to other components through the interconnection interface chiplet.

* * * * *